(12) United States Patent
Hsu et al.

(10) Patent No.: US 7,679,926 B2
(45) Date of Patent: Mar. 16, 2010

(54) CAPACITORS WITH INSULATING LAYER HAVING EMBEDDED DIELECTRIC RODS

(75) Inventors: Kuo-Ching Steven Hsu, Chung-Ho (TW); Chien-Min Lin, Taipei (TW); Tzong-Lin Wu, Taipei (TW); Guan-Tzong Wu, Hualien County (TW)

(73) Assignee: Taiwan Semiconductor Manfacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 11/843,382

(22) Filed: Aug. 22, 2007

(65) Prior Publication Data

US 2009/0050356 A1    Feb. 26, 2009

(51) Int. Cl.
*H05K 1/18* (2006.01)

(52) U.S. Cl. .................. 361/763; 174/260; 361/302

(58) Field of Classification Search .......... 174/260; 361/302, 763
See application file for complete search history.

(56) References Cited

U.S. PATENT DOCUMENTS

| 5,953,203 | A | 9/1999 | Tormey et al. |
| 5,973,929 | A | 10/1999 | Arkawa et al. |
| 6,068,782 | A | 5/2000 | Brandt et al. |
| 6,215,372 | B1 * | 4/2001 | Novak ..................... 333/12 |
| 6,407,930 | B1 | 6/2002 | Hsu |
| 6,430,030 | B1 * | 8/2002 | Farooq et al. ............ 361/321.2 |
| 7,100,277 | B2 | 9/2006 | Borland et al. |
| 2002/0054467 | A1 * | 5/2002 | Tsai et al. .................. 361/302 |
| 2006/0091495 | A1 * | 5/2006 | Palanduz et al. ............ 257/532 |

OTHER PUBLICATIONS

Wu, et al., "A Photonic Crystal Power/Ground Layer for Eliminating Simultaneously Switching Noise in High-Speed Circuit," IEEE Transactions on Microwave Theory and Techniques, vol. 54, No. 8, Aug. 2006, pp. 3398-3406.
Chen, et al., "Photonic Crystal Power Substrate for Wireband Suppression of Power/Ground Bounce Noise and Radiated Emission in High-speed Packages," IEEE EMC Newsletter, Summer 2006, pp. 70-72.

* cited by examiner

*Primary Examiner*—Jinhee J Lee
*Assistant Examiner*—Andargie M Aychillhum
(74) *Attorney, Agent, or Firm*—Slater & Matsil, L.L.P.

(57) ABSTRACT

A circuit structure is provided. The circuit structure includes a capacitor including a top capacitor electrode; a bottom capacitor electrode parallel to the top capacitor electrode; and an insulating layer between the top and the bottom capacitor electrodes. The insulating layer includes a dielectric rod enclosed by a dielectric material. The dielectric rod has a higher dielectric constant than that of the dielectric material. The circuit structure may be a printed circuit board or packaging substrate, wherein the capacitor is formed between the two layers of the capacitor. Additional dielectric rods may be formed in the insulating layer of the capacitor and spaced apart from the dielectric rods.

20 Claims, 6 Drawing Sheets

CAPACITORS WITH INSULATING LAYER HAVING EMBEDDED DIELECTRIC RODS

TECHNICAL FIELD

This invention relates generally to the decoupling capacitors, and more particularly to the capacitors embedded in the substrate or printed circuit boards.

BACKGROUND

High-speed integrated circuits often require the capacitors having a great capacitance density. For example, the bypass capacitors are often used for the reserving power and the decoupling capacitors are used to filter the fluctuating noises. Due to the small sizes of semiconductor chips, the capacitors embedded in the semiconductor dies can only have the large capacitances within the constrained area, often far smaller than required.

Figure 1:
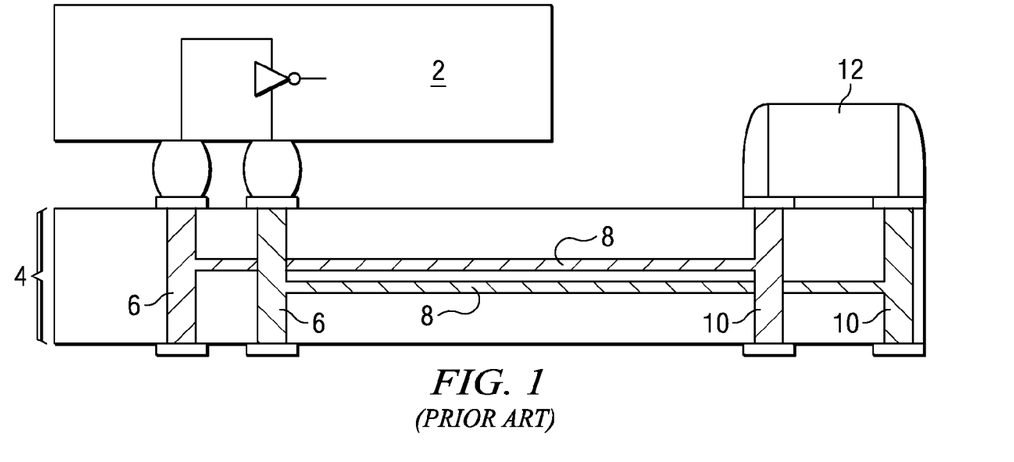
FIG. 1 illustrates a conventional packaging structure including a discrete surface-mount capacitor.

To increase the capacitance density of capacitors, discrete surface-mount capacitors were used, as illustrated in FIG. 1. The semiconductor chip 2 is electrically connected to the packaging substrate 4, which includes the plated vias 6. Through the routing metal traces 8, the semiconductor chip 2 is electrically connected to the vias 10, and further to the surface-mount capacitor 12. The surface-mount capacitor 12 is a discrete capacitor and hence can provide a very big capacitance.

The structure shown in FIG. 1 suffers from the drawbacks. In the high-frequency applications, the simultaneous switching noise (SSN) becomes an important factor for the system performance. The resonance modes of a parallel-plate waveguide as equivalent for the typical substrate structure can be excited by SSN and cause serious signal integrity and electromagnetic interference problems. Since the surface-mount capacitor 12 is usually spaced far away from the semiconductor chip 2, it has an inferior ability to suppress the SSN due to the large loop inductance.

Figure 2:
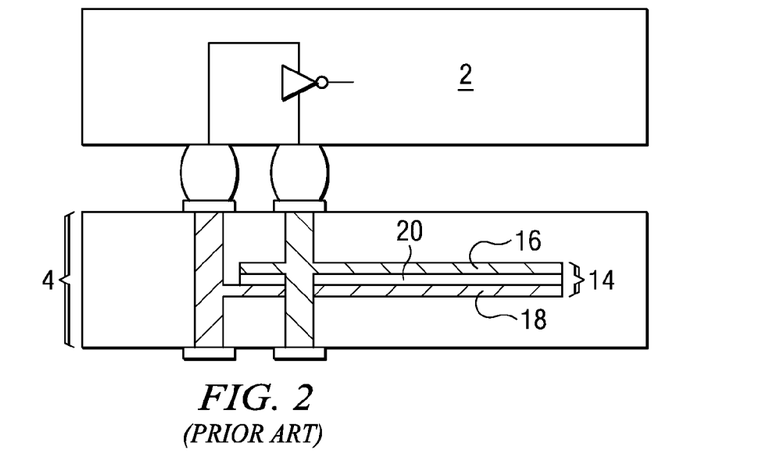
FIG. 2 illustrates a conventional printed circuit board having an embedded capacitor.

To reduce the distance between capacitors and semiconductor chips, the embedded capacitors, which are formed inside the substrate, were developed. FIG. 2 schematically illustrates the conventional embedded capacitor 14, which includes the top electrode 16 and bottom electrode 18 separated by the insulating layer 20. One or both of the top electrode 16 and bottom electrode 18 may be formed in one of the existing layers of substrate 4, wherein the existing layers may include the signal layers, power layers, ground layers, and the like.

A typical method for increasing the capacitance of embedded capacitors shown in FIG. 2 is to fill in the insulating layer 20 with a very high dielectric constant material. However, it is very hard to find and process such materials. Even if such materials are available, the electrical performances of these materials are often not satisfactory. For example, DuPont provides a material having a dielectric constant of about 3000. However, the stop-bands of the resulting embedded capacitors do not have the central frequencies and bandwidths great enough for the high-frequency applications.

Accordingly, what is needed in the art is a semiconductor device that provides a high capacitance while at the same time overcoming the deficiencies of the prior art.

SUMMARY OF THE INVENTION

In accordance with one aspect of the present invention, a circuit structure is provided. The circuit structure includes a capacitor including a top capacitor electrode; a bottom capacitor electrode parallel to the top capacitor electrode; and an insulating layer between the top and the bottom capacitor electrodes. The insulating layer includes a set of dielectric rods encircled by a dielectric material. The dielectric rod has a higher dielectric constant than that of the dielectric material.

In accordance with another aspect of the present invention, a printed circuit board (PCB) includes a signal layer; a power layer; a ground layer, wherein the signal layer, the power layer, and the ground layer are insulated from each other by dielectric layers; and an insulating layer between two of the signal layer, the power layer, and the ground layer. The insulating layer includes a plurality of dielectric rods arranged with a periodic pattern; and a dielectric material separating the plurality of dielectric rods, wherein the dielectric material and the plurality of dielectric rods comprise the different materials.

In accordance with yet another aspect of the present invention, a printed circuit board (PCB) includes a signal layer; a power layer; a ground layer, wherein the signal layer, the power layer, and the ground layer are insulated from each other by dielectric layers; and an insulating layer between two layers of the PCB. The insulating layer includes a plurality of identical units adjoining each other, each comprising a dielectric rod encircled by a dielectric material. The dielectric rod has a higher dielectric constant than that of the dielectric material.

The advantageous features of the present invention include the increased capacitance without the need of insulating layers having the higher dielectric constant, and the improved high-frequency performance.

BRIEF DESCRIPTION OF THE DRAWINGS

For a more complete understanding of the present invention, and the advantages thereof, the reference is now made to the following descriptions taken in conjunction with the accompanying drawings, in which.

DETAILED DESCRIPTION OF ILLUSTRATIVE EMBODIMENTS

The making and using of the presently preferred embodiments are discussed in details below. It should be appreciated, however, that the present invention provides many applicable inventive concepts that can be embodied in a wide variety of specific contexts. The specific embodiments discussed are merely illustrative of specific ways to make and use the invention, and do not limit the scope of the present invention.

A novel capacitor and the methods of forming the same structure are presented. Throughout the various views and illustrative embodiments of the present invention, like the reference numbers are used to designate like the elements.

Figure 3A:
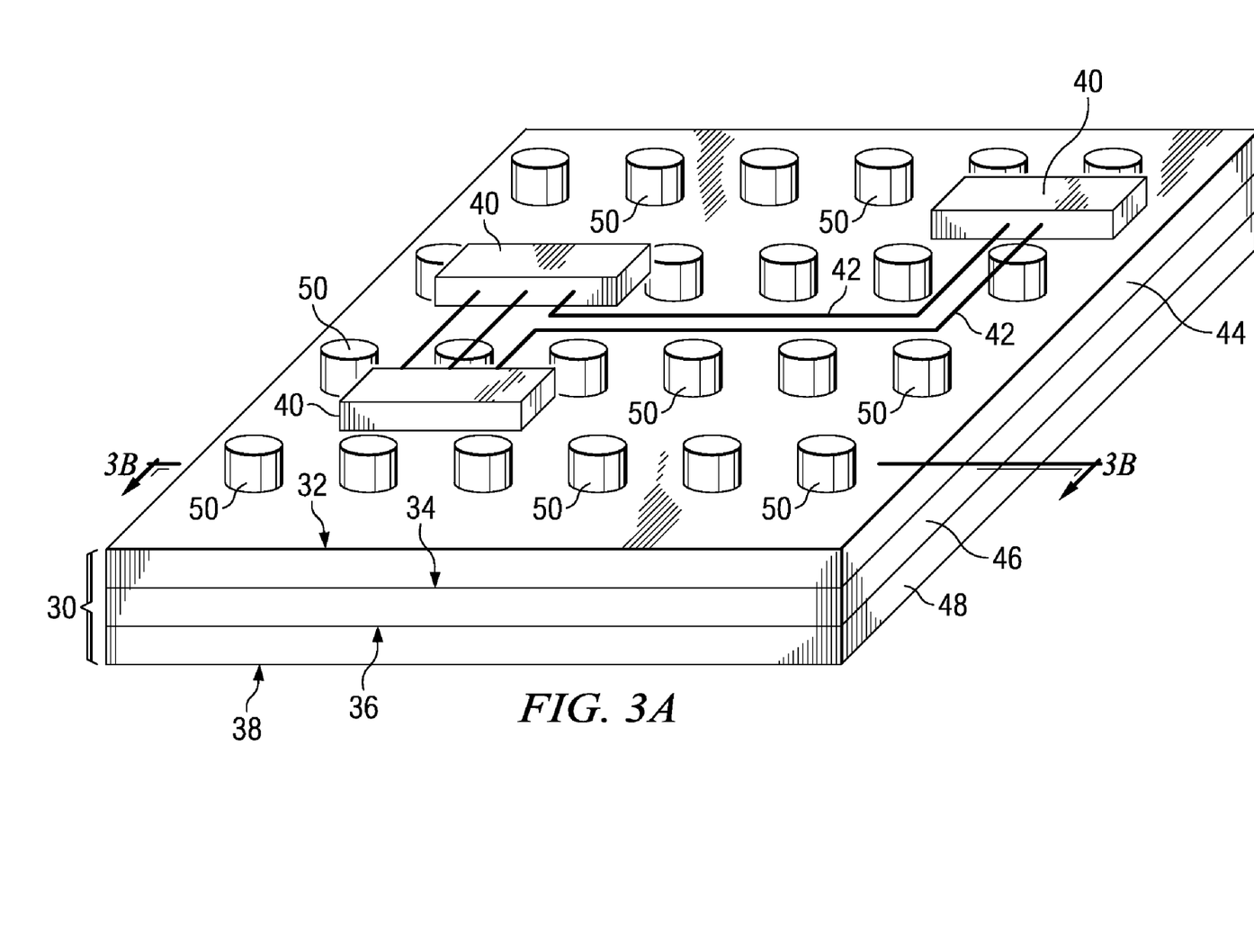
FIGS. 3A and 3B are a perspective view and a cross-sectional view of an embodiment of the present invention, respectively, wherein the dielectric rods with a higher dielectric constant are embedded between a signal layer and a power layer of a printed circuit board.

FIG. 3A illustrates a perspective view of an embodiment of printed circuit board (PCB) 30. In an exemplary embodiment, PCB 30 includes the signal layer 32, power layer 34, ground layer 36, and signal layer 38. As is known in the art, the signal layers 32 and 38 are used to route the electrical connections, while the power layer 34 and ground layer 36 are used for connecting the power supply voltages VDD and VSS, respectively. Integrated circuit (IC) chips 40 are mounted on PCB 30, and are interconnected by the metal traces 42 on the signal layer 32.

Figure 3B:
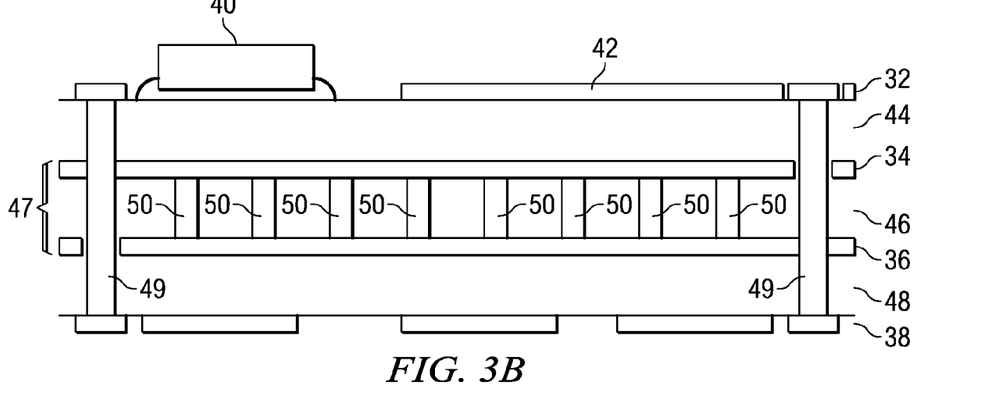

FIG. 3B illustrates a cross-sectional view of the structure shown in FIG. 3A, wherein the cross-sectional view is taken along a plane crossing the line 3B-3B. Preferably, the signal layers 32 and 38, power layer 34, and ground layer 36 are formed of metals or metal alloys, such as the copper or copper alloys, and are separated from each other by the dielectric layers 44, 46 and 48. In an exemplary embodiment, the dielectric layers 44, 46 and 48 include ABF GX3, which has a dielectric constant of about 3.4. A plurality of dielectric rods 50 is formed in the dielectric layer 46, which is between the power layer 34 and ground layer 36. Preferably, dielectric rods 50 have a dielectric constant (Dk value) of greater than the dielectric constant of the surrounding dielectric material. More preferably, dielectric rods 50 have a dielectric constant of greater than about 30 or 300 (dependent on the central frequency of designed bandwidths), and hence are alternatively referred to as the high-Dk rods 50 throughout the description. In the illustrated drawings, the high-Dk rods 50 are shown as having the circular shapes (in a top view). However, other shapes, such as squares, triangles, polygons, and the like, may also be used.

In an exemplary embodiment, the high-Dk rods 50 are formed with a dielectric constant of about 23. The embedded capacitor 47 is thus formed, wherein the power layer 34 and ground layer 36 act as two electrodes, and the dielectric layer 46 and high-Dk rods 50 act as the insulating layer. Vias 49 connect the two electrodes of the embedded capacitor 47 to the signal layer 32. The high-Dk rods 50 may be distributed substantially across an entirety of the dielectric layer 46. Alternatively, the high-Dk rods 50 are only in a sub-region of the dielectric layer 46.

Figure 4A:
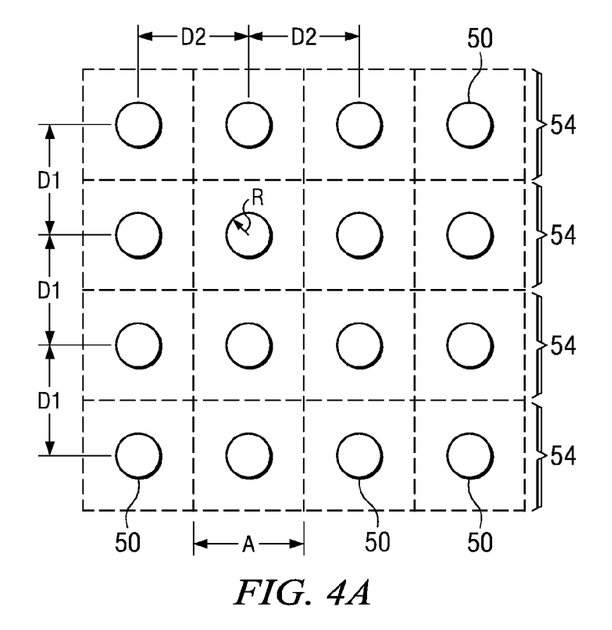
FIG. 4A illustrates a top view of the dielectric rods, wherein the dielectric rods form an array having a square lattice.

FIG. 4A illustrates a top view of high-Dk rods 50 and layer 46 as shown in FIG. 3A. Preferably, the rods 50 are embedded periodically between the power layer 34 and ground layer 36. Throughout the description, the terms "periodic" and "periodically" refer to high-Dk rods 50 having either a repeated pattern, or patterns in which the distances between rows (or columns) of rods 50 are integer times of a unit distance. The high-Dk rods 50 may have a square lattice (and hence forming an array) with a plurality of rows and columns. In the preferred embodiment, the distances D1 between the rows are the same. Similarly, the distances D2 between the columns are the same. More preferably, distances D1 are equal to distances D2.

Each of the high-Dk rods 50 and surrounding materials of the insulating layer 46 may be considered as a rod unit 54. In the structure shown in FIG. 4A, the rod units 54 are squares. In an exemplary embodiment for the radius R of high-Dk rods 50 and the width A of rod units 54, its ratio of R/A is preferably about 0.2.

Figure 4B:
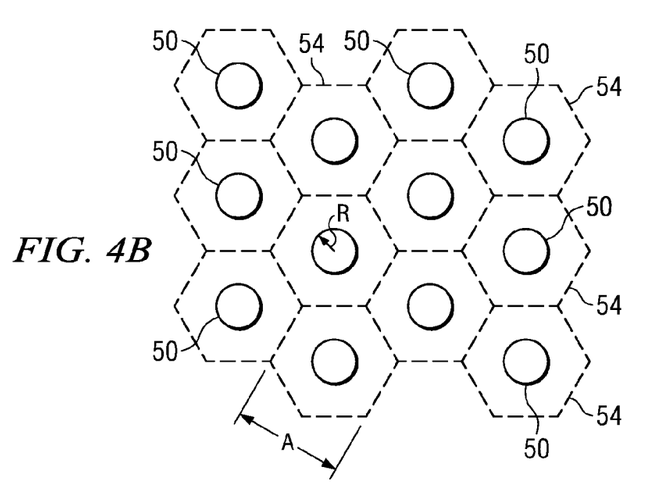
FIG. 4B illustrates a top view of the dielectric rods, wherein the dielectric rods have a triangle lattice.

In alternative embodiments, as shown in FIG. 4B, the high-Dk rods 50 are arranged to have a triangle lattice and hence each of the rod units has a shape of a hexagon. Accordingly, each of the high-Dk rods 50 has the equal distance from the neighboring high-Dk rods 50.

Figure 4C:
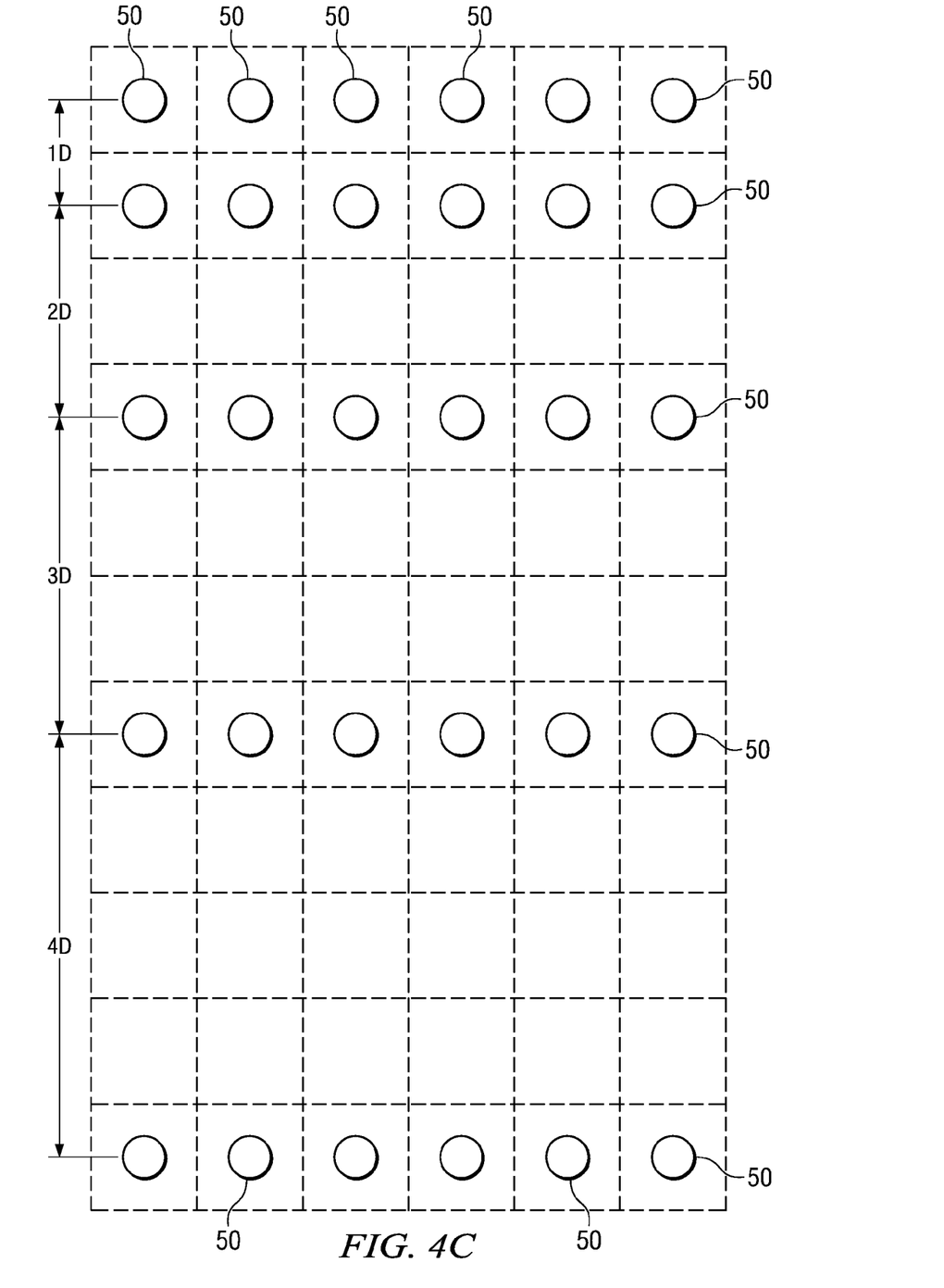
FIG. 4C illustrates a top view of the dielectric rods, wherein the distances between rows of the dielectric rods are of integer times of a unit distance.

In yet other embodiments, the high-Dk rods 50 may be arranged in other periodic patterns. For example, the distances between rows can be expressed as nD, wherein n is an integer and D is a unit distance. An exemplary embodiment is shown in FIG. 4C, wherein the distance between the first and the second rows of high-Dk rods 50 is D, the distance between the second and the third rows of high-Dk rods 50 is 2D, and the distance between the third and the fourth rows of high-Dk rods 50 is 3D. The distances between columns of high-Dk rods 50 may be equal to each other, or be expressed as mD, wherein m is an integer and D is a unit distance. It is noted that the concepts of "row" and "column" are interchangeable and dependent on the direction from which the PCB is viewed.

Figure 5:
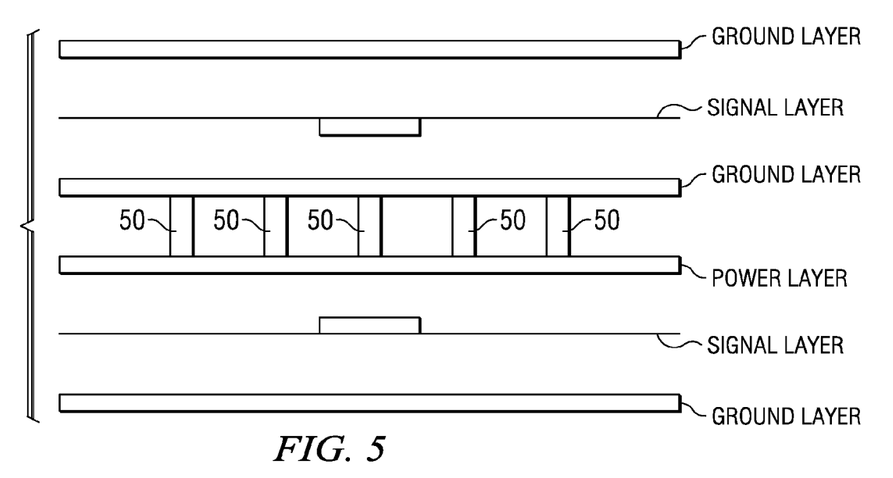
FIG. 5 illustrates an embodiment of the present invention, wherein a printed circuit board includes more than four layers.

As one skilled in the art will realize, a PCB may include more than four layers, such as six layers, eight layers, and even twelve layers. The concept of the present invention is still readily applicable. FIG. 5 illustrates an exemplary PCB board having six layers, including three ground layers and two signal layers shielded by the ground layers. Preferably, the high-Dk rods 50 are placed between the power layer and the ground layer although they can be in the different layers, as will be discussed in details in the subsequent paragraphs.

Figure 6:
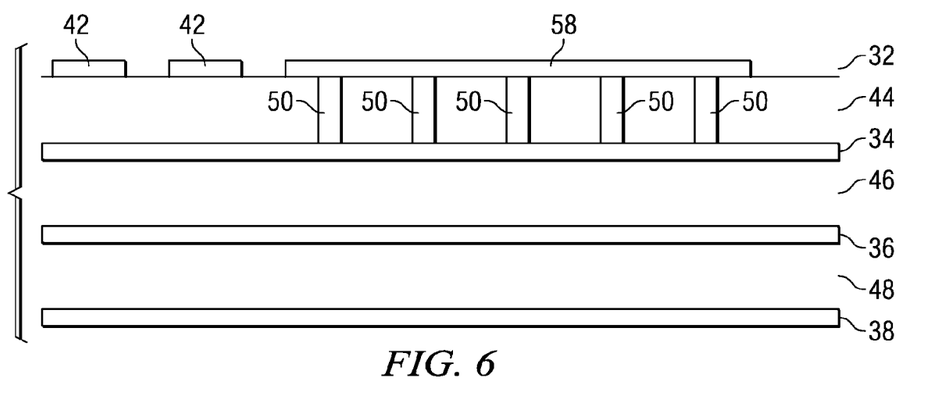
FIG. 6 illustrates an embodiment of the present invention, wherein dielectric rods are embedded between a power layer and a signal layer.
Figure 7:
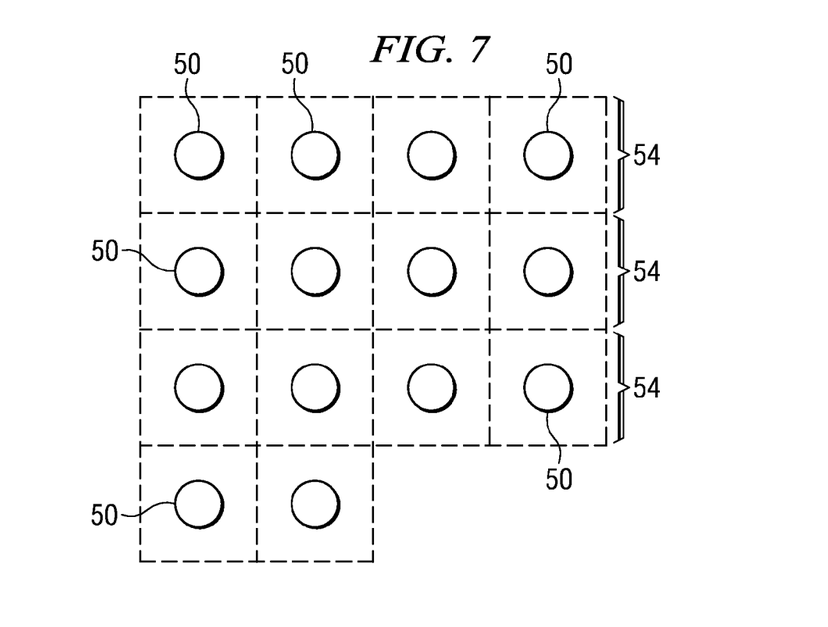
FIG. 7 illustrates an embodiment, wherein the dielectric rods have an irregular contour in the shape arrangement.

In FIG. 6, instead of being formed between the power layer 34 and ground layer 36, the high-Dk rods 50 may be placed between other neighboring layers, such as the signal layer 32 and power layer 34. In this case, a top electrode 58 on the signal layer 32 may need to be isolated from other metal traces 42, which are used for the routing signals. Alternatively, the high-Dk rods 50 may be placed between the signal layer 38 and power layer 36. Since the signal layers typically include a plurality of metal traces, for the convenience of routing the signal traces, the contour of the region occupied by the top electrode 58 may have an irregular shape, for example, as shown in FIG. 7.

Figure 8:
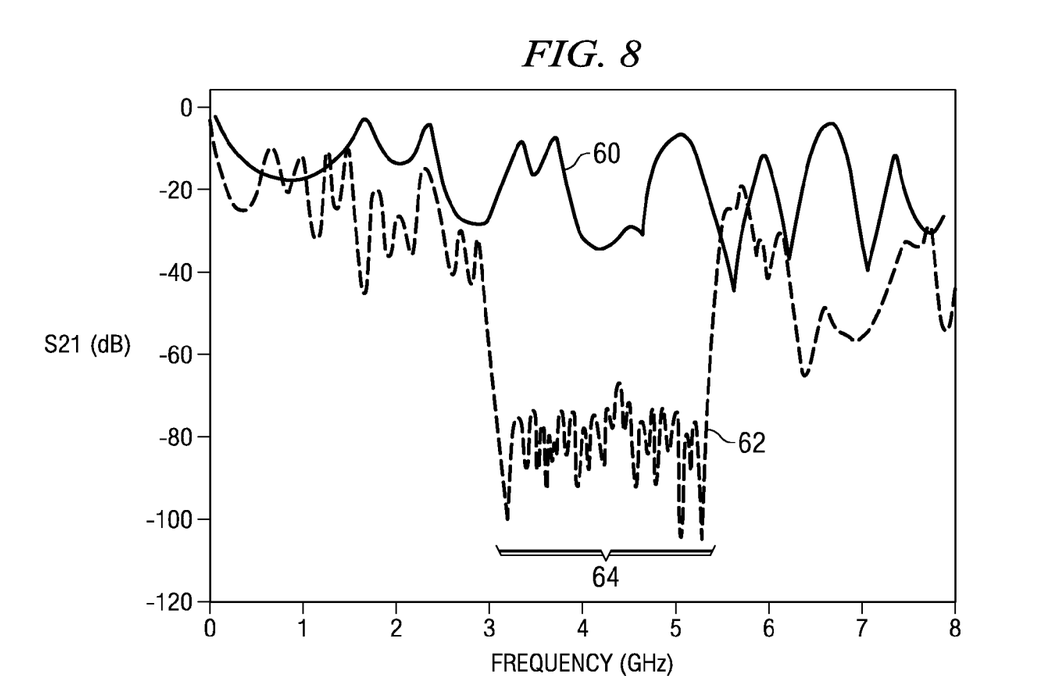
FIG. 8 illustrates the S21 parameter of power transmissions as a function of frequency, wherein a result obtained from an embodiment of the present invention is compared to a result obtained from a reference printed circuit board.

Experiment results reveal that the embodiments of the present invention have significantly increased the capacitance per unit area over the conventional capacitors having the continuous dielectric materials between the capacitor plates. Even though in the conventional capacitors, the insulating materials may have the very high dielectric constants. The high-frequency performance of capacitors of the present invention is also improved. In terms of the S21 parameters, FIG. 8 compares the power transmission of a reference PCB (a first sample without the high-Dk rods) and a PCB (a second sample) having the built-in high-Dk rods, wherein the power transmission S21 parameters are shown as a function of frequency. The line 60 is the result of the first sample and the dot-line 62 is the result of the second sample. For the second sample, it is noted that a significant (noise) stop-band 64 is found at from about 2.6 GHz to about 5.2 GHz, with a bandwidth of about 2.6 GHz. Within the stop-band 64, the coupling noise is reduced by about 60 dB over the first sample. It proves that the embedded capacitor of the present invention has an excellent noise-filtering ability, which may be provided by the advantageous periodic arrangement of high-Dk dielectric rods 50. As a comparison, no noticeable stop-band is found in the first sample.

Experiments were also performed on the embedded capacitors shown in FIGS. 4A and 4B to investigate the noise-suppression effects of embedded high-Dk rods in their electrical performance. As a demonstrated example, the analysis results of varying embedded capacitor structures shown in FIG. 4A are listed in Table 1.

TABLE 1

| | Central Frequency | | |
|---|---|---|---|
| | 5.8 GHz | 10.1 GHz | 14.9 GHz |
| R (μm) | 2,000 | 1,100 | 850 |
| A (μm) | 10,000 | 6,600 | 4,000 |
| R/A | 0.20 | 0.17 | 0.21 |
| Bandwidth | 1.5 GHz | 2.4 GHz | 3.8 GHz |
| Rod Array | 4 × 4 | 6 × 6 | 5 × 5 |
| Capacitor Size (mm × mm) | 40 × 40 | 39.6 × 39.6 | 20 × 20 |

Wherein the central frequency and the bandwidth are the central frequency and the bandwidth of stop-band 64 in reference to FIG. 8. The results illustrate that the radius R and width A of rod units 54 (referred to FIGS. 4A and 4B) are the important parameters affecting the performance of the resulting capacitance. The appropriate central frequency and bandwidth may be obtained by tuning the radius R of high-Dk rods 50 (or the width of high-Dk rods 50 if they are not circular), width A of rod units 54, and the numbers of rows/columns of the rod array. In an exemplary embodiment, to increase the central frequency and the bandwidth, the sizes of rod units 54 may be reduced, which may involve in reducing the radius R and width A. The optimum values of radius R, width A, and the number of rods may be found through experiments. In the experiment results shown in Table 1, a rod array with five rows and five columns, although having a smaller area of only 20 mm×20 mm, has a peak central frequency and a bandwidth greater than a 4×4 rod array and a 5×5 rod array.

The embodiments of the present invention have several advantageous features. First, the capacitors of the present invention have the high capacitance-per-unit-area without the need of using a dielectric material with the super high dielectric constant. Second, the capacitors of the present invention have the broad-band noise-suppression ability. Furthermore, the central frequency and the bandwidth of the stop-band (in which the noise is suppressed) are adjustable by adjusting the dimensions and the structures of high-Dk rods. Third, the embodiments of the present invention are the cost-effective solutions in the high-speed decoupling designs.

Although the present invention and its advantages have been described in details, it should be understood that the various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skills in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure comprising:
   a capacitor comprising:
      a top capacitor electrode disposed between a first via and a second via;
      a bottom capacitor electrode parallel to the top capacitor electrode, the bottom capacitor electrode disposed between the first and the second vias, the top capacitor electrode being coupled to the first via and the bottom capacitor electrode being coupled to the second via; and
      an insulating layer between the top and the bottom capacitor electrodes, wherein the insulating layer comprises a plurality of dielectric rods encircled by a dielectric material, and wherein the plurality of dielectric rods is disposed between the first and the second vias and has a higher dielectric constant than that of the dielectric material.

2. The circuit structure of claim 1, wherein top surfaces of the plurality of dielectric rods and the dielectric material adjoin the top capacitor electrode, and wherein bottom surfaces of the plurality of dielectric rods and the dielectric material adjoin the bottom capacitor electrode.

3. The circuit structure of claim 1, wherein the plurality of dielectric rods are spaced apart from each other by at least a minimum distance.

4. The circuit structure of claim 1 comprising a printed circuit board, wherein the top and the bottom capacitor electrodes are two layers of the printed circuit board.

5. The circuit structure of claim 3, wherein the plurality of dielectric rods are arranged with periodic patterns.

6. The circuit structure of claim 3, wherein the plurality of dielectric rods are spaced apart from each other by an integral multiple of the minimum distance.

7. The circuit structure of claim 4, wherein the top capacitor electrode is a power layer and the bottom capacitor electrode is a ground layer.

8. The circuit structure of claim 5, wherein the plurality of dielectric rods are arranged as an array.

9. The circuit structure of claim 5, wherein the plurality of rods has a triangle lattice.

10. A printed circuit board (PCB) or substrate comprising:
    a signal layer;
    a power layer;
    a ground layer, wherein the signal layer, the power layer, and the ground layer are insulated from each other by dielectric layers; and
    an insulating layer between two adjacent conductive layers, the two adjacent conductive layers being the signal layer and one of the power layer and the ground layer, wherein the insulating layer comprises:
       a plurality of dielectric rods arranged with a periodic pattern; and
       a dielectric material separating the plurality of dielectric rods, wherein the dielectric material and the plurality of dielectric rods comprise different materials.

11. The PCB of claim 10, wherein the plurality of dielectric rods has a dielectric constant greater than a dielectric constant of the dielectric material.

12. The PCB of claim 10, wherein the plurality of dielectric rods is between the power layer and the ground layer.

13. The PCB of claim 10, wherein the plurality of dielectric rods is between the signal layer and the power layer.

14. The PCB of claim 10, wherein the plurality of dielectric rods forms an array having more than one row and more than one column.

15. The PCB of claim 10, wherein the plurality of dielectric rods is distributed substantially throughout an entirety of the insulating layer.

16. The PCB of claim 10, wherein a ratio of a horizontal dimension of one of the dielectric rods to a distance between two of the nearest rods is between about 0.1 and about 0.3.

17. A printed circuit board (PCB) comprising:
a signal layer;
a power layer;
a ground layer, wherein the signal layer, the power layer, and the ground layer are insulated from each other by dielectric layers; and
an insulating layer between the signal layer and a selected one of the power or ground layers of the PCB, wherein another one of the power or ground layers is not between the signal layer and the selected one of the power or ground layers and wherein the insulating layer comprises a plurality of identical units adjoining each other, each unit of the plurality of identical units comprising a dielectric rod enclosed by a dielectric material, and wherein the dielectric rod has a higher dielectric constant than that of the dielectric material.

18. The PCB of claim 17, wherein the plurality of identical units has a square shape.

19. The PCB of claim 17, wherein the plurality of identical units has a hexagon shape.

20. The PCB of claim 18, wherein the dielectric rod has a circular shape, and wherein a ratio of a radius of dielectric rods to a width of one of the plurality of dielectric units is between about 0.1 and about 0.3.

* * * * *